United States Patent [19]
Berg

[11] 4,044,339
[45] Aug. 23, 1977

[54] BLOCK ORIENTED RANDOM ACCESS MEMORY

[75] Inventor: Robert O. Berg, Roseville, Minn.

[73] Assignee: Honeywell Inc., Minneapolis, Minn.

[21] Appl. No.: 641,044

[22] Filed: Dec. 15, 1975

[51] Int. Cl.² .............................................. G11C 8/00
[52] U.S. Cl. .............................................. 340/173 R
[58] Field of Search ................................... 340/173 R

[56] References Cited
U.S. PATENT DOCUMENTS

| | | | |
|---|---|---|---|
| 3,492,470 | 1/1970 | Gorbatenko | 235/181 |
| 3,614,751 | 10/1971 | Narisawa | 340/173 R |
| 3,927,396 | 12/1975 | Can | 340/173 R |

*Primary Examiner*—Stuart N. Hecker
*Attorney, Agent, or Firm*—Henry L. Hanson

[57] ABSTRACT

A block oriented random access memory (BORAM) utilizes a shift register to sequentially address each word of a selected memory block.

3 Claims, 3 Drawing Figures

BLOCK ORIENTED RANDOM ACCESS MEMORY

BACKGROUND OF THE INVENTION

This invention relates generally to semiconductor memory devices. In particular, the present invention is concerned with a block oriented random access memory (BORAM) having improved addressing of individual blocks of the memory.

Block oriented random access memories have application in large memory systems in which individual blocks of the memory are randomly accessed. All of the data within the block is then written or read out in a given order. BORAMs have been designated as a means of reducing the expense of randomly accessed read/write memories and as a means of achieving faster read and write times.

U.S. Pats. Nos. 3,895,360 by Cricchi et al. and 3,898,632 by Spencer describe integrated circuit memory devices for use in a block oriented random access memory. In these prior art BORAMs, addressing of an N × M memory array is accomplished by using $\log_2 N$ input lines. The addressing of the memory array is provided by an address buffer and a word decoder, which converts the $\log_2 N$ signals into N addresses for the N × M memory array.

These prior art devices have several disadvantages as a result of the addressing system which they use. First, they require a large number of input pins (a total of $\log_2 N + 2$) in order to address, load the buffer, and select a particular chip. Additional input/output pins increase the cost of the integrated circuit package and the assembly cost at both the integrated circuit and system levels. Second, the address buffer and word decorder require a considerable amount of space on the integrated circuit chip.

SUMMARY OF THE INVENTION

In the present invention, the shortcomings of the addressing system used in prior art block oriented random access memories are overcome. Sequential addressing means associated with the memory block sequentially address each word of the memory block in a predetermined order. As a result, the number of input/output pins is significantly reduced and the space on the chip required by the addressing means is reduced.

DETAILED DESCRIPTION OF THE PREFERRED EMBODIMENTS

Figure 1:
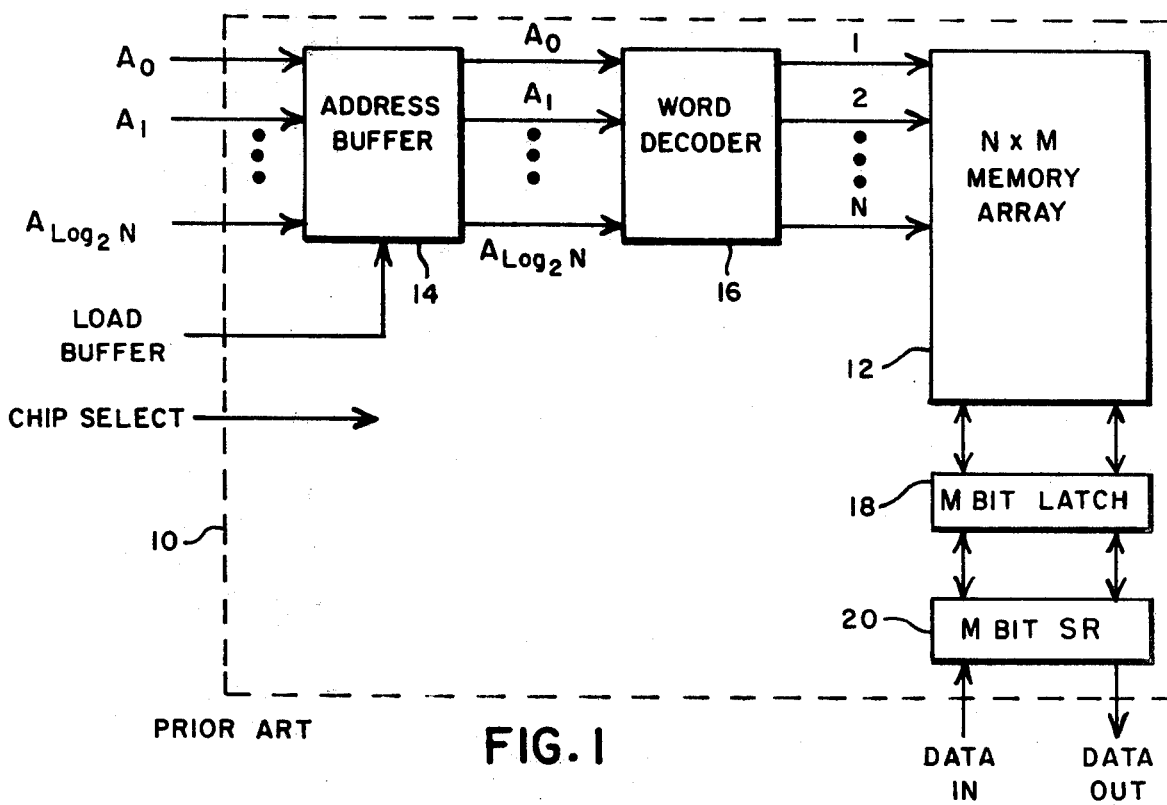
FIG. 1 shows a prior art integrated circuit BORAM.

In FIG. 1, a prior art integrated circuit chip 10 for use in a block oriented random access memory (BORAM) is shown. Integrated circuit chip 10 includes an N × M memory array 12 which contains N words of M bits each. The individual words of N × M memory array are addressed by addressing means including address buffer 14 and word decoder 16. The input and output of data to and from memory array 12 is provided by M-bit latch 18 and M-bit shift register 20.

As shown in FIG. 1, $\log_2 N + $ "the load buffer" input lines are used to bring the word address to the address buffer 14, where the word address is held. Word decoder 16 then enables the correct word of the memory to allow read or write operation of the memory. In addition, a chip select line, which increases the power on the chip to operational levels, is provided. Input and output pins are also required for data into the M-bit shift register and for data out of the M-bit shift register 20.

As shown in FIG. 1, the prior art chip requires $\log_2 N + 2$ pins in order to address individual words of the N × M memory array 12. This increases the cost of the integrated circuit package and the assembly cost of both the integrated circuit and the system in which the integrated circuit is used. In addition, address buffer 14 and word decoder 16 require a substantial amount of space on the integrated circuit chip.

In a block oriented memory, an entire block of words is read or written upon request. The order of word addressing is always sequential, and operation does not cease until each word in the block has been addressed. The present invention is a unique addressing scheme which takes advantage of the sequential nature of block oriented random access memories.

Figure 2:
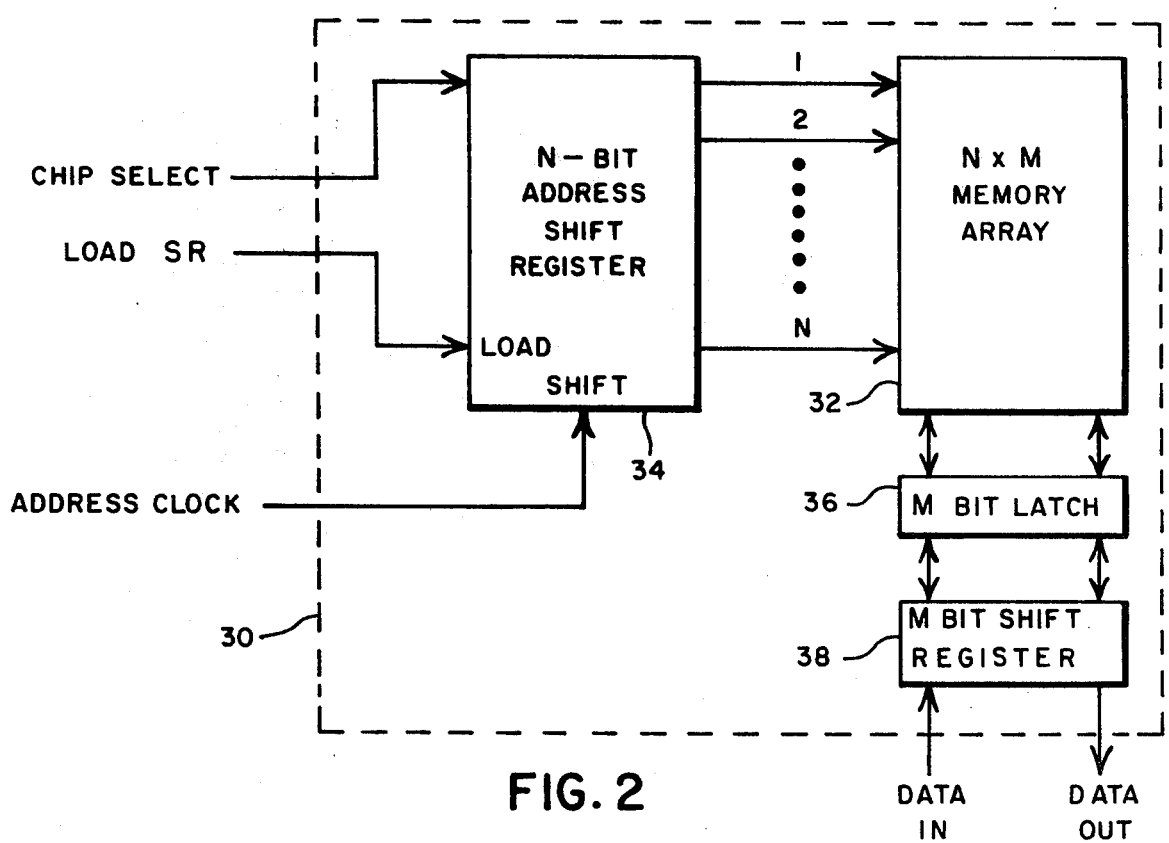
FIG. 2 shows one embodiment of the BORAM of the present invention.

FIG. 2 shows one embodiment of the block oriented memory of the present invention. Integrated circuit chip 30 includes N × M memory array 32, N-bit address shift register 34, M-bit latch 36, and M-bit shift register 38. N-bit shift register 34 forms a sequential addressing means which is associated with memory block 32 to sequentially address each word of memory block 32 in a predetermined order when memory block 32 is selected.

In one preferred embodiment of the present invention, the address, at the system level, of the desired block of data causes the proper system memory chips to produce a high level on the desired chip select input line. This line is connected to the least significant bit of address shift register 34. When a "load shift register" pulse is sent at the beginning of a block cycle, a logic "1" or first signal level is loaded into the least significant bit portion of address shift register 34. Disabled chips, on the other hand, will have all zeros in the address shift register. After the first word has been read (or written) by means of M-bit latch 36 and M-bit shift register 38, the address clock input, which is connected to the shift input of address shift register 34, causes address shift register 34 to shift one bit place. The movement of the logic "1" causes the addressing of a second word. This process if continued until the logic "1" is shifted off the end of address shift register 34, after addressing the last word of memory array 32.

Address shift register 34 can be either static (as shown), requiring only a single clock, or dynamic, requiring two or more clocks. The trade-off is between input/output pins and device geometry and power dissipation.

The advantages of the present invention are a reduction in the number of input pins, and the active chip area saved by replacing the prior art address buffer and word decoder by a shift register. In the prior art approach of FIG. 1, a total of $\log_2 N + 3$ pins are required for addressing, loading the buffer 14, and enabling the chip. The invention as shown in FIG. 2 requires only three pins (chip select, load shift register, and address clock). Thus the input/output pins are reduced by $\log_2 N - 1$ pins. In a 512 word by 4 bit memory array on a chip, this invention saves 8 chip pads, and thus eight package pins. Similarly, the present invention saves 4 pins for a 64 word by 32 bit chip organization.

The active chip area required for a 64 bit dynamic (2 phase) shift register is approximately 800 square mills. The conventional word decoder, address buffer, and interconnections used in the prior art approximately 2200 square mills for a 64 word memory. An area saving on an integrated circuit chip of nearly 3 to 1 is, therefore, achieved with the present invention. For a chip with more words of memory, the savings are even more impressive.

Figure 3:
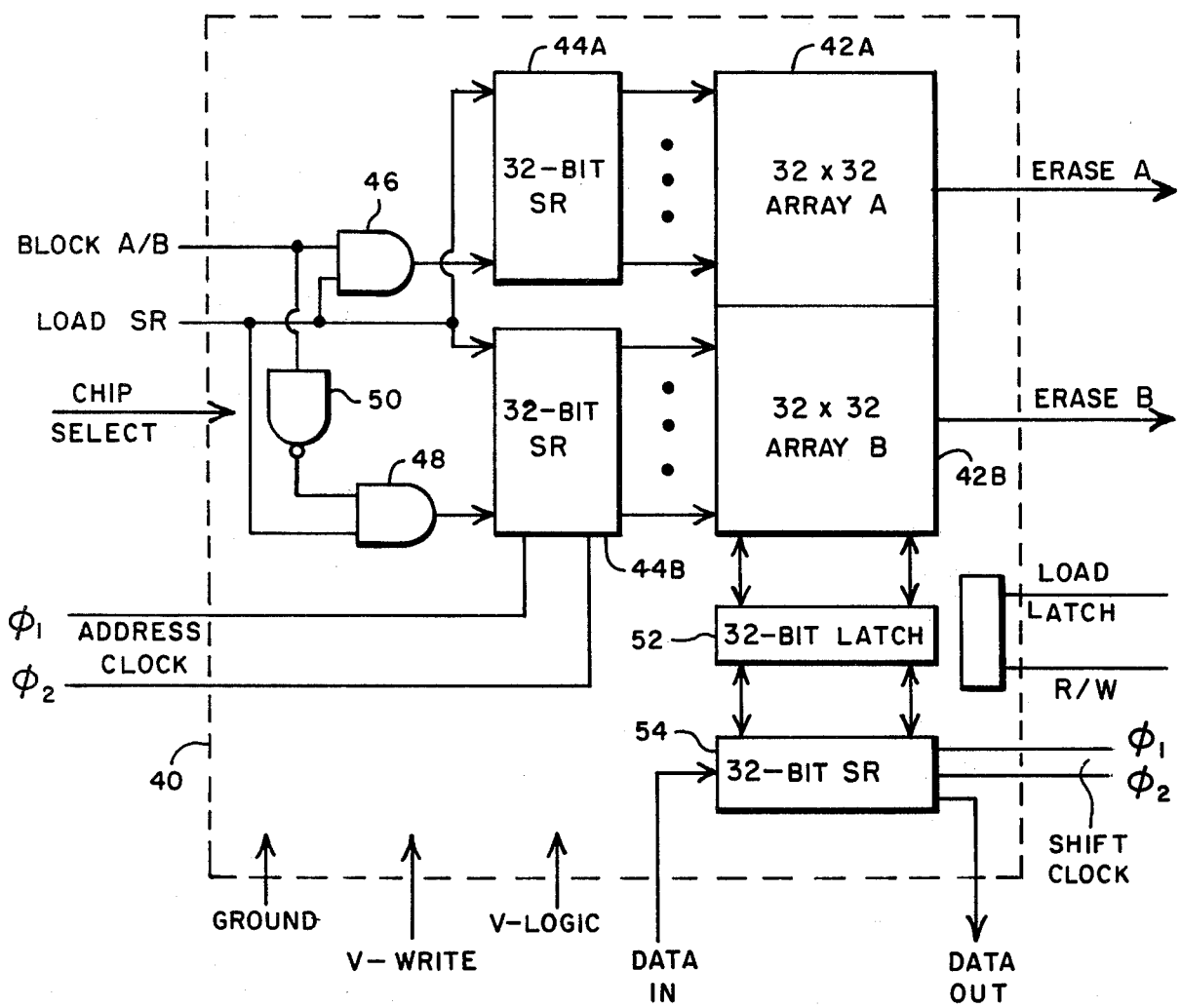
FIG. 3 shows another embodiment of the present invention in which two memory blocks are included in a single integrated circuit chip.

In some applications, the size of the memory block is not as large as the number of words on the semiconductor chip. In such cases, the embodiment shown in FIG. 3 is more appropriate. In FIG. 3, the block size (or the maximum portion of one block to be stored in a single chip) is 32 words by 32 bits. This allows more granularity in block size.

The memory chip 40 shown in FIG. 3 stores data in two unique memory blocks 42A and 42B. A 32-bit address shift register 44A is associated with memory block 42A, and a 32-bit address shift register 44B is associated with memory block 42B.

In order to select the proper address shift register, AND gates 46 and 48 and NAND gate 50 are provided. These logic gates receive the "Block A/B" input and the "Load Shift Register" signal. The proper shift register is then both enabled and loaded with a logic "1". The reading and writing of data in the memory is again performed by a latch 52 and a shift register 54.

In operation, when a chip is selected, the chip select line causes chip 40 to receive operational power. The Load Register signal and the Block A/B signal are received by logic gates 46, 48, and 50. The output from logic gate 46 or 48 loads a logic "1" into the least significant bit of either shift register 44A or 44B, depending upon the state of the Block A/B line. The load shift register input is applied to both shift registers and enables both shift registers. Since only one of the shift registers has been loaded with a logic "1", however, only that shift register will be effective in addressing a block of data.

As shown in FIG. 3, shift register 44A, 44B, and 54 are dynamic shift register requiring two clock lines $\phi_1$ and $\phi_2$. For clarity, the address clock lines are not shown as connected to shift register 44A, but in fact, the clock lines would be connected to shift register 44A as well as 44B.

The integrated circuit chip 40 of FIG. 3 requires a total of 16 input/output pins. The Block A/B and Load Shift Register lines are used to select the particular address shift register and, therefore, the particular memory block which will be addressed. The Chip Select line powers the entire chip when one of the blocks on the chip has been selected. Two sets of address clock lines $\phi_1$ and $\phi_2$ are provided. The first set controls shift registers 44A and 44B, and the second set controls shift register 54. Ground, V-write, and V-logic lines are also provided, and are standard for integrated circuit memory chips of this type.

The Data In and Data Out lines read data into or out of shift register 54. The Load Latch and Read/Write ("R/W") lines control the operation of latch 52 and determine whether data is being read out or written into the memory blocks. Finally, the Erase lines A and B are provided to erase data stored in memory arrays 42A and 42B.

With the embodiments shown in FIG. 3, the chip area saving is very similar to that of FIG. 2. The input/output pin saving over that of the prior art BORAMs is $\log_2 N - 2$ for a static shift register, or $\log_2 N - 3$ for the two-phase dynamic shift registers shown in FIG. 3.

As shown in FIG. 3, the present invention is applicable to memory technologies (i.e. floating gate avalanche MOS or MNOS) which require erasure prior to writing. This is The purpose of the erase lines A and B. The present invention, however, is also applicable to conventional metal oxide or bipolar semiconductor memory technologies. In this case, Erase lines A and B would not be required.

The present invention is also applicable to integrated circuit chips in which more than two memory blocks are contained on a single chip. Generally, if the number of memory blocks is S, the present invention requires $\log_2 S$ terminals in order to identify the selected memory block. In the case where S is greater than two, the present invention still provides a significant savings in chip area and input/output pins over the prior art BORAM integrated circuit chips.

In conclusion, the present invention is a block oriented random access memory which achieves significant cost savings over the prior art memory chip. These advantages are the result of the improved addressing system of the present invention. Although the invention has been described with reference to a series of preferred embodiments, workers skilled in the art will recognize that changes may be made in form and details without departing from the spirit and scope of the present invention.

The embodiments of the invention in which an exclusive property or right is claimed are defined as follows:

1. An integrated circuit for use in a block oriented random access memory, the integrated circuit comprising:
    a memory block for storing a plurality of words, the memory block comprising an N × M memory array having N words of M bits each;
    terminal means for receiving block select signals;
    sequential addressing means associated with the memory block for sequentially addressing each word of the memory block in a predetermined order when the memory block is selected, the sequential addressing means comprising an N bit shift register wherein each bit of the N bit shift register is connected to one of the N words of the N × M memory array and wherein each word of the N × M memory array is addressed when the bit of the N bit shift register to which it is connected attains a first level;
    loading means for loading a signal of the first level in one end of the N bit shift register when the memory block is selected, and wherein the shift register is adapted to receive clock signals and to shift sequentially the signal of the first level from the one end of the N bit shift register to an opposite end, and then off the end, in response to the clock signals, whereby each word of the memory block is sequentially addressed in a predetermined order;
    data input means for entering data into each addressed word in response to an input signal; and
    data output means for reading out data from each addressed word in response to an output signal.

2. The integrated circuit of claim 1 wherein the data input means and the data output means comprise:
    an M bit latch connected to the N × M memory array; and
    an M bit shift register connected to the M bit latch.

3. An integrated circuit for use in a block oriented random access memory, the integrated circuit comprising:

S memory blocks, wherein S is an integer greater than zero, each memory block for storing a plurality of words, wherein each memory block comprises an N/S × M memory array having N/S words of M bits each;

terminal means for receiving signals which identify a selected memory block, the terminal means including $\log_2 S$ terminals for receiving $\log_2 S$ signals which identify a selected memory block;

sequential addressing means associated with each memory block for sequentially addressing each word of the memory block in a predetermined order when enabled, the sequential addressing means comprising S shift registers of N/S bits each, each N/S bit shift register being associated with one of the S memory blocks, wherein each bit of the N/S bit shift register is connected to one of the N/S words of the N/S × M memory array and wherein each word of the N/S × M memory array is addressed when the bit of the N/S bit shift register to which it is connected attains a first level;

enabling means connected to the terminal means for enabling a selected N/S bit shift register; and loading means for loading the signal of the first level in one end of the proper N/S bit shift register when a memory block is selected, wherein the N/S bit shift register is adapted to receive clock signals and to shift sequentially the signal of the first level from the one end of the shift register to an opposite end, and then off, in response to the clock signals whereby each word of the selected memory block is sequentially addressed in a predetermined order.

* * * * *